(12) United States Patent
Sommer

(10) Patent No.: US 8,134,395 B2
(45) Date of Patent: Mar. 13, 2012

(54) LEAKAGE POWER OPTIMIZED STRUCTURE

(75) Inventor: Ralph Sommer, Munich (DE)

(73) Assignee: LSI Corporation, Milpitas, CA (US)

( * ) Notice: Subject to any disclaimer, the term of this patent is extended or adjusted under 35 U.S.C. 154(b) by 366 days.

(21) Appl. No.: 12/511,429

(22) Filed: Jul. 29, 2009

(65) Prior Publication Data

US 2011/0025393 A1 Feb. 3, 2011

(51) Int. Cl.
*H03K 3/00* (2006.01)
(52) U.S. Cl. .......................... 327/217; 327/216; 327/202
(58) Field of Classification Search .................. 327/199, 327/202, 211, 212, 216–218, 225, 544
See application file for complete search history.

(56) References Cited

U.S. PATENT DOCUMENTS

| | | | | |
|---|---|---|---|---|
| 4,980,577 A | * | 12/1990 | Baxter | 327/198 |
| 5,625,309 A | * | 4/1997 | Fucili et al. | 327/217 |
| 7,109,772 B2 | * | 9/2006 | Tohsche | 327/218 |

* cited by examiner

*Primary Examiner* — Long Nguyen
(74) *Attorney, Agent, or Firm* — Luedeka Neely Group, P.C.

(57) ABSTRACT

A digital latch circuit substantially reduces leakage current in output stages of edge-triggered digital switching devices. The circuit comprises first and second NAND gates for receiving first and second input signals and providing first and second output signals. The first NAND gate includes a first A input for receiving the first input signal, a first B input connected to a second NAND gate output, a first leakage current control input connected to a second A input of the second NAND gate, and a first NAND gate output for providing the first output signal. The second NAND gate includes the second A input for receiving the second input signal, a second B input connected to the first NAND gate output, a second leakage current control input connected to the first A input of the first NAND gate, and the second NAND gate output for providing the second output signal. The leakage current through the first NAND gate is substantially reduced based on application of the second input signal to the first leakage current control input. Similarly, the leakage current through the second NAND gate is substantially reduced based on application of the first input signal to the second leakage current control input. This circuit may comprise a set-reset latch in an output stage of an edge-triggered sequential switching device, such as a D flip-flop or a JK master-slave flip-flop.

14 Claims, 4 Drawing Sheets

LEAKAGE POWER OPTIMIZED STRUCTURE

FIELD

This invention relates to the field of submicron integrated circuits. More particularly, this invention relates to reducing or eliminating leakage current in deep submicron transistor switches triggered by the edge of a clock signal.

BACKGROUND

In deep submicron digital circuit structures, transistors sizes have been scale down and supply voltages and switching thresholds have been reduced to create faster circuits. As a result, transistor switches cannot be completely switched off. This causes leakage current to flow from source to drain, which results in a problematic loss of power in combinational cells and sequential cells.

To address this problem, fabricators of silicon structures of ninety nanometers and smaller have created logic library variants with different transistor switching thresholds that can be mixed together. To some degree this allows for power optimization by swapping between different threshold classes for each logic cell depending on the timing budget. However, this has not been a satisfactory solution.

What is needed, therefore, are submicron digital switching circuits having low switching thresholds and low leakage currents.

SUMMARY

The above and other needs are met by a latch circuit comprising first and second NAND gates for receiving first and second input signals and providing first and second output signals. The first NAND gate includes a first A input for receiving the first input signal, a first B input connected to a second NAND gate output, a first leakage current control input connected to a second A input of the second NAND gate, and a first NAND gate output for providing the first output signal. The second NAND gate includes the second A input for receiving the second input signal, a second B input connected to the first NAND gate output, a second leakage current control input connected to the first A input of the first NAND gate, and the second NAND gate output for providing the second output signal. The leakage current through the first NAND gate is substantially reduced based on application of the second input signal to the first leakage current control input. Similarly, the leakage current through the second NAND gate is substantially reduced based on application of the first input signal to the second leakage current control input.

In some embodiments of the latch circuit, the first NAND gate includes a first pair of parallel-connected PMOS transistors, one having a gate connected to the first A input and the other having a gate connected to the first B input. The first NAND gate of these embodiments also includes a first PMOS transistor having a drain connected to sources of the first pair of parallel-connected PMOS transistors, a source connected to the first NAND gate output, and a gate connected to first leakage current control input. The first NAND gate further includes a first pair of series-connected NMOS transistors, one having a gate connected to the first A input and a drain connected to the first NAND gate output, and the other having a gate connected to the first B input.

The second NAND gate of some embodiments includes a second pair of parallel-connected PMOS transistors, one having a gate connected to the second A input and the other having a gate connected to the second B input. The second NAND gate also includes a second PMOS transistor having a drain connected to sources of the second pair of parallel-connected PMOS transistors, a source connected to the second NAND gate output, and a gate connected to second leakage current control input. The second NAND gate further includes a second pair of series-connected NMOS transistors, one having a gate connected to the second A input and a drain connected to the second NAND gate output, and the other having a gate connected to the second B input.

In these embodiments, the second input signal applied to the gate of the first PMOS transistor causes the first PMOS transistor to switch off, thereby substantially reducing leakage current flowing through the first pair of parallel-connected PMOS transistors and the first pair of series-connected NMOS transistors. Similarly, the first input signal applied to the gate of the second PMOS transistor causes the second PMOS transistor to switch off, thereby substantially reducing leakage current flowing through the second pair of parallel-connected PMOS transistors and the second pair of series-connected NMOS transistors.

In another aspect, embodiments of the invention provide a digital switching circuit that receives a clock signal and a data signal and generates a first output signal and a second output signal based on the clock signal and the data signal. The digital switching circuit of these embodiments includes an input stage and an output stage. The input stage includes a clock input for receiving the clock signal, a data input for receiving the data signal, a first set-reset latch for generating a first node signal on a first node, and a second set-reset latch for generating a second node signal on a second node.

The output stage includes first and second NAND gates. The first NAND gate has a first A input connected to the first node of the input stage, a first B input connected to an output of the second NAND gate, a first leakage current control input connected to the second node of the input stage, and a first NAND gate output for providing the first output signal. The second NAND gate has a second A input connected to the second node of the input stage, a second B input connected to the output of the first NAND gate, a second leakage current control input connected to the first node of the input stage, and the output of the second NAND gate for providing the second output signal.

The leakage current through the first NAND gate is substantially reduced based on application of the second node signal to the first leakage current control input. Similarly, leakage current through the second NAND gate is substantially reduced based on application of the first node signal to the second leakage current control input.

In some embodiments, the output stage of the digital switching circuit comprises a set-reset latch, and in some embodiments, the input stage and the output stage together comprise an edge-triggered D flip-flop.

In yet another aspect, embodiments of the invention provide a digital switching circuit that receives a clock signal, a first data signal and a second data signal, and generates a first output signal and a second output signal based on the clock signal and the first and second data signals. The digital switching circuit of these embodiments comprises a master input stage, a master output stage, a slave input stage, and a slave output stage.

The master input stage has a first input NAND gate and a second input NAND gate. The first input NAND gate includes a clock input for receiving the clock signal, a J input for receiving the first data signal, and an output for providing a first node signal on a first node. The second input NAND gate includes a clock input for receiving the clock signal, a K input for receiving the second data signal, and an output for providing a second node signal on a second node.

The master output stage includes a first output NAND gate and a second output NAND gate. The first output NAND gate includes a first A input connected to the first node, a first B input connected to an output of the second output NAND gate, a first leakage current control input connected to the second node, and an output for providing a third node signal on a third node. The second output NAND gate includes a second A input connected to the second node, a second B input connected to the output of the first output NAND gate, a second leakage current control input connected to the first node, and the output of the second output NAND gate for providing a fourth node signal on a fourth node.

The slave input stage has a third input NAND gate and a fourth input NAND gate. The third input NAND gate includes a clock input for receiving the clock signal, an input for receiving the third node signal, and an output for providing a fifth node signal on a fifth node. The fourth input NAND gate includes a clock input for receiving the clock signal, an input for receiving the fourth node signal, and an output for providing a sixth node signal on a sixth node.

The slave output stage includes a third output NAND gate and a fourth output NAND gate. The third output NAND gate includes a third A input connected to the fifth node, a third B input connected to an output of the fourth output NAND gate, a third leakage current control input connected to the sixth node, and an output for providing the first output signal. The fourth output NAND gate includes a fourth A input connected to the sixth node, a fourth B input connected to the output of the third output NAND gate, a fourth leakage current control input connected to the third node, and the output of the second output NAND gate for providing the second output signal.

Leakage current through the first output NAND gate is substantially reduced based on application of the second node signal to the first leakage current control input, leakage current through the second output NAND gate is substantially reduced based on application of the first node signal to the second leakage current control input, leakage current through the third output NAND gate is substantially reduced based on application of the sixth node signal to the third leakage current control input, and leakage current through the fourth output NAND gate is substantially reduced based on application of the fifth node signal to the fourth leakage current control input.

In some embodiments, the master input stage, master output stage, slave input stage, and the slave output stage together comprise an edge-triggered JK master-slave flip-flop.

BRIEF DESCRIPTION OF THE DRAWINGS

Further advantages of the invention are apparent by reference to the detailed description in conjunction with the figures, wherein elements are not to scale so as to more clearly show the details, wherein like reference numbers indicate like elements throughout the several views, and wherein.

DETAILED DESCRIPTION

Embodiments of leakage current reduction circuits according to the present invention are described herein as applied to edge-triggered sequential cells, such as flip-flops. The embodiments described herein are applicable to an edge-triggered D flip-flop circuit and an edge-triggered JK flip-flop circuit. One skilled in the art will appreciate that other embodiments of the invention are applicable to other types of edge-triggered sequential cells and combinational cells.

Figure 1:
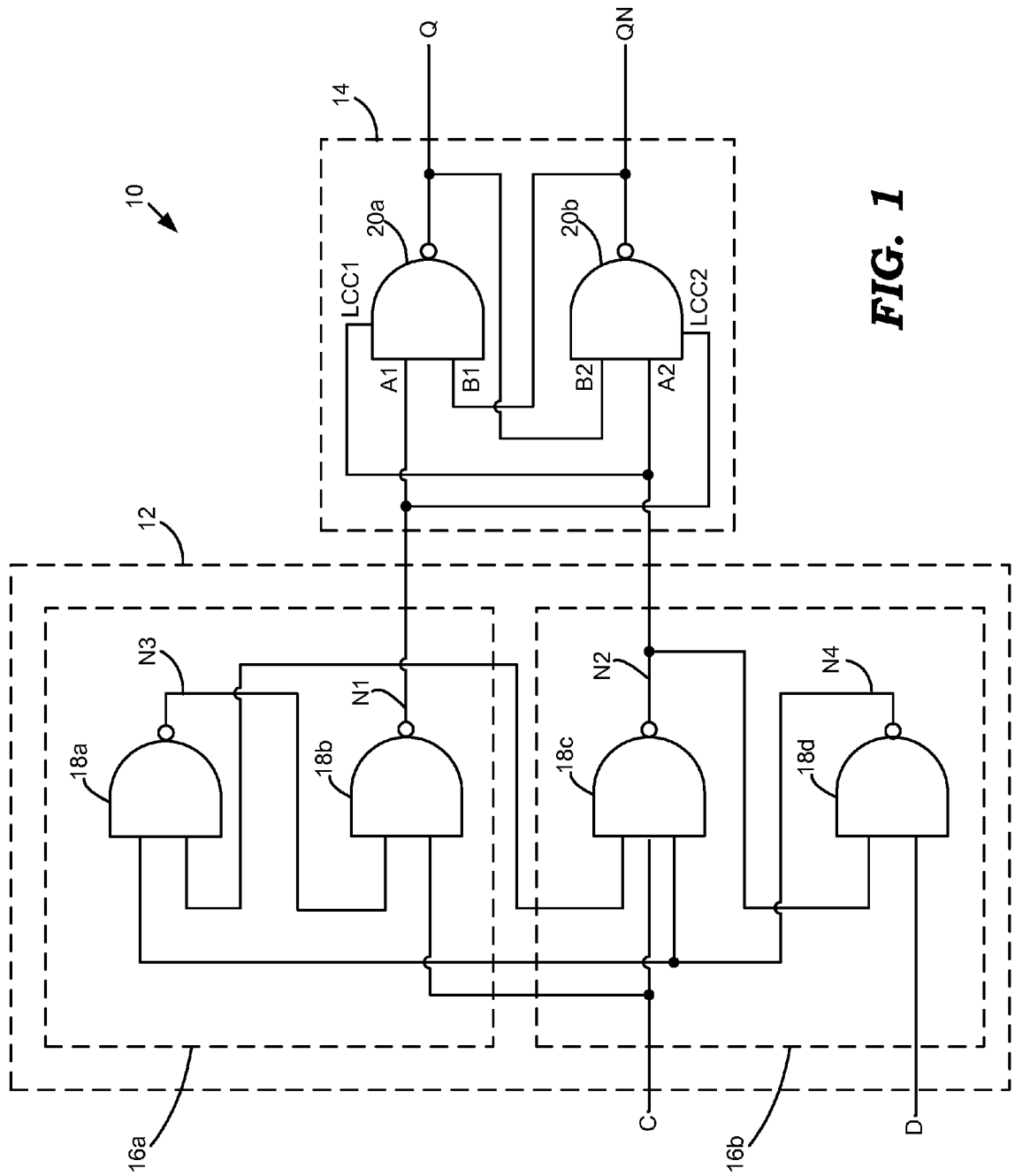
FIG. 1 depicts a schematic diagram of an edge-triggered D flip-flop switching circuit according to an embodiment of the present invention.

As shown in FIG. 1, a switching circuit 10 comprises an edge-triggered D flip-flop that includes an input stage 12 having a clock input C and a data input D, and an output stage 14 having an output Q and an output QN. The input stage 12 includes a pair of NAND gates 18a and 18b that together comprise a first set-reset latch 16a, and a pair of NAND gates 18c and 18d that together comprise a second set-reset latch 16b. The output stage 14 includes a first NAND gate 20a and a second NAND gate 20b that together comprise an output set-reset latch. The first NAND gate 20a has a first A input A1, a first B input B1, a first leakage current control input LCC1 and the output Q. The second NAND gate 20b has a second A input A2, a second B input B2, a second leakage current control input LCC2 and the output QN.

Figure 3:
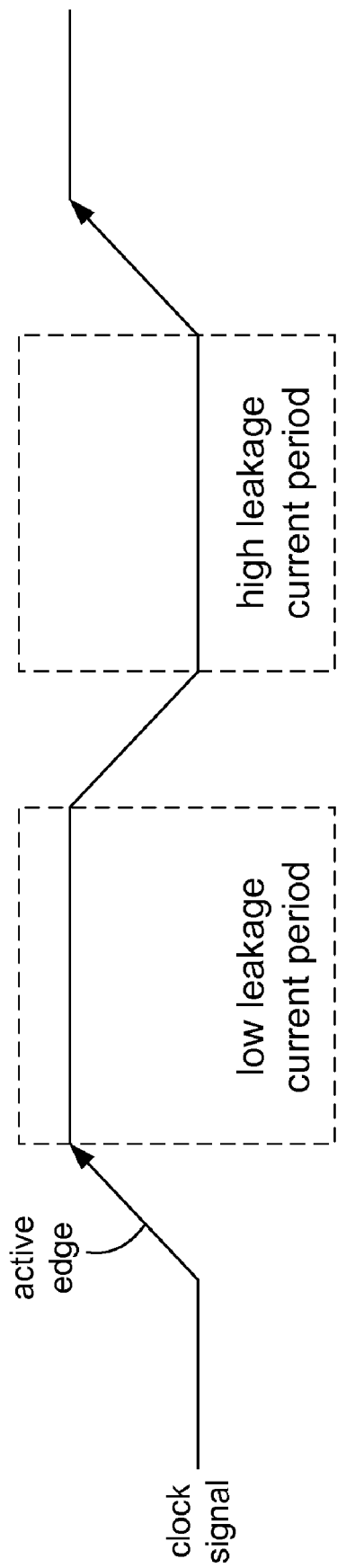
FIG. 3 depicts characteristics of a clock signal at a clock input of an edge-triggered transistor switching circuit according to an embodiment of the present invention.

Operation of the edge-triggered D flip-flop is set forth in Table I below with reference to four internal nodes N1, N2, N3 and N4 as depicted in FIG. 1. FIG. 3 depicts an example of a clock signal which may be present at the clock input C.

TABLE I

| Clock | Data | N3 | N1 | N2 | N4 | Q | QN |
|---|---|---|---|---|---|---|---|
| 0 | 0 | 0 | 1 | 1 | 1 | Q | QN |
| 1 (rise) | 0 | 0 | 1 | 0 | 1 | 0 | 1 |
| 1 | 1 | 0 | 1 | 0 | 1 | 0 (Q) | 1 (QN) |
| 0 | 1 | 1 | 1 | 1 | 0 | 0 (Q) | 1 (QN) |
| 1 (rise) | 1 | 1 | 0 | 1 | 0 | 1 | 0 |
| 1 | 0 | 1 | 0 | 1 | 1 | 1 (Q) | 0 (QN) |

As indicated by the highlighted portions of Table I, the nodes N1 and N2 are at a "0" logic state only when the clock input C is high. Since there is no switching activity in the output stage 14 when the nodes N1 and N2 are at a "0" logic state, the leakage current paths in the output stage 14 may be completely opened when the clock input C is high, thereby significantly reducing or eliminating leakage currents.

Figure 2:
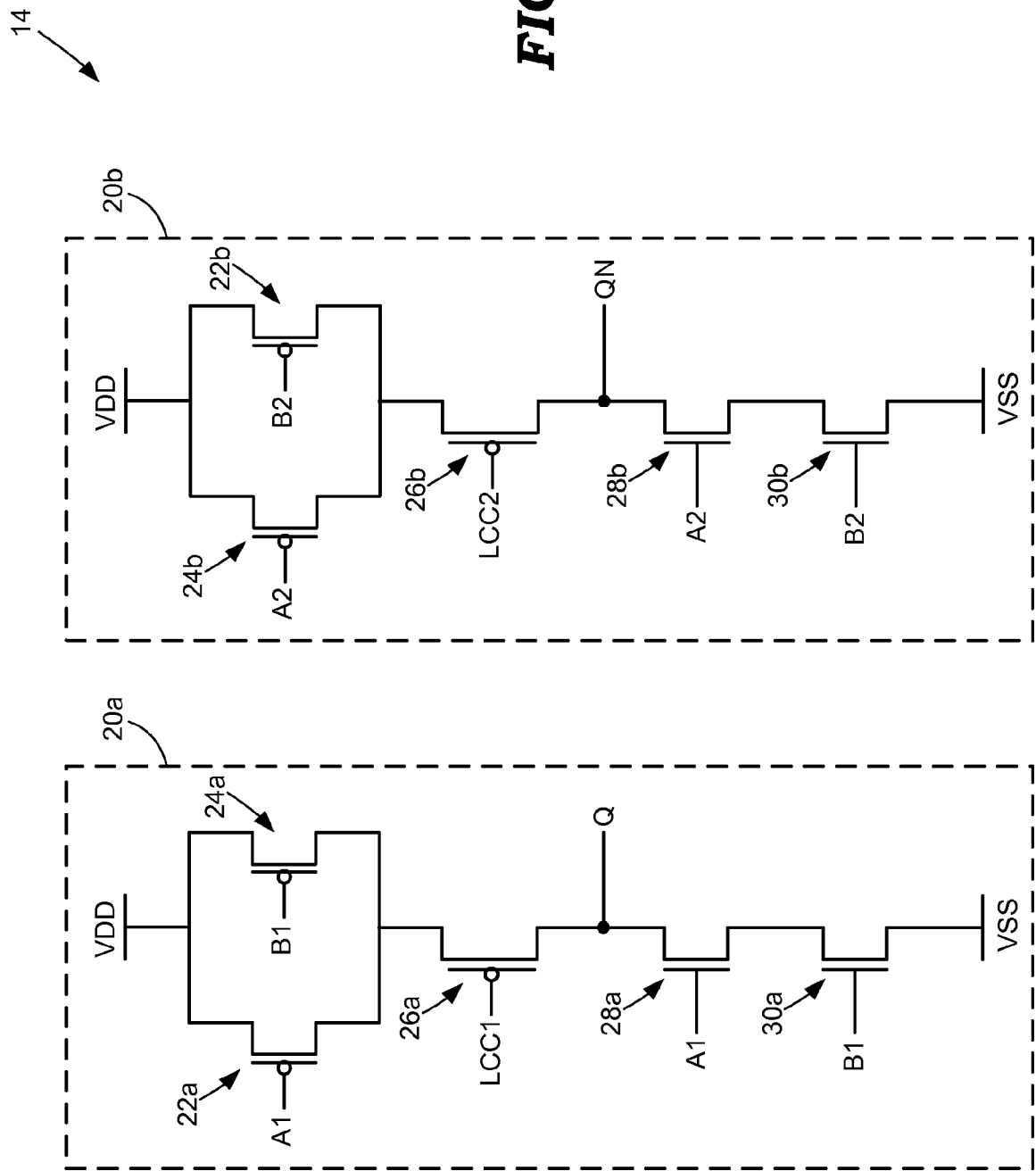
FIG. 2 depicts a schematic diagram of a pair of modified NAND gates of an output portion of an edge-triggered D flip-flop switching circuit according to an embodiment of the present invention.

As shown in FIG. 2, the opening of the leakage current paths in the output stage 14 is accomplished by high-threshold transistors 26a and 26b in the output NAND gates 20a and 20b. The NAND gates 20a and 20b are also referred to herein as modified NAND gates (as compared to standard NAND gates) because they include the additional transistors 26a and 26b and additional inputs LCC1 and LCC2 at the gates of the transistors 26a and 26b. The transistor 26a, which is preferably implemented as a PMOS device in series with the PMOS transistors 22a and 24a and the NMOS transistors 28a and 30a, reduces the parasitic leakage current flowing from the source (VSS) to the drain (VDD). Similarly, the transistor 26b, which is preferably implemented as a PMOS device in series with the PMOS transistors 22b and 24b and the NMOS transistors 28b and 30b,reduces the parasitic leakage current flowing from VSS to VDD.

Since the nodes N1 and N2 are never at a logic "0" state simultaneously, the leakage current reduction accomplished by the transistors 26a-26b only applies to one of the NAND gates 20a-20b at a time depending on the logic state of the flip-flop 10. This ensures that the overall performance of the flip-flop 10 is not affected by having the high threshold switches 26a-26b in the critical timing path.

A low-to-high transition on the output Q is initiated by the node N1 changing from logical value "1" to "0". The high-threshold transistor 26a does not change its state during this transition because the node N2 connected to its gate maintains the logical value "1". A high-to-low transition on the output Q is initiated by the node N2 changing from logical value "1" to "0". The output Q changes in a second step as a result of the output QN toggling from "0" to "1". This two step process determines the maximum switching time for the high-threshold transistor 26a.

Similarly, a low-to-high transition on the output QN is initiated by the node N2 changing from logical value "1" to "0". The high-threshold transistor 26b does not change its state during this transition because the node N1 connected to its gate maintains the logical value "1". A high-to-low transition on the output QN is initiated by the node N1 changing from logical value "1" to "0". The output QN changes in a second step as a result of the output Q toggling from "0" to "1". This two step process determines the maximum switching time for the high-threshold transistor 26b.

Figure 4:
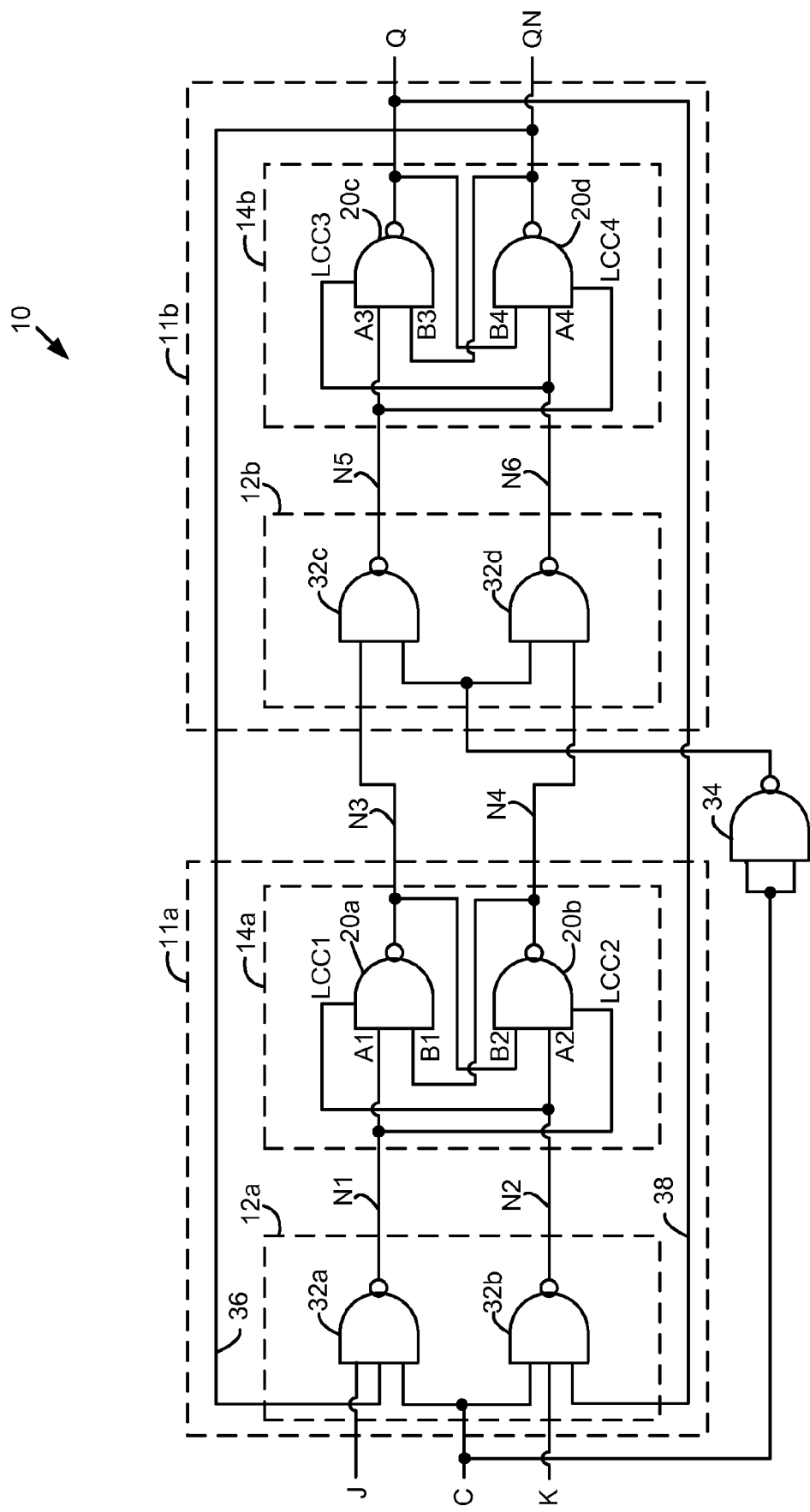
FIG. 4 depicts a schematic diagram of an edge-triggered JK master-slave flip-flop switching circuit according to an embodiment of the present invention.

FIG. 4 depicts an alternative embodiment wherein the switching circuit 10 comprises an edge-triggered JK master-slave flip-flop which includes a master stage 11a and a slave stage 11b. The master stage 11a includes a master input stage 12a having a clock input C, a data input J, a data input K, a first input NAND gate 32a and a second input NAND gate 32b. The output of the first input NAND gate 32a is connected to the node N1 and the output of the second input NAND gate 32b is connected to the node N2.

The master stage 11a includes a master output stage 14a having a first output NAND gate 20a and a second output NAND gate 20b which together comprise an output set-reset latch. The first output NAND gate 20a has a first A input A1, a first B input B1, a first leakage current control input LCC1 and an output connected to the node N3. The second output NAND gate 20b has a second A input A2, a second B input B2, a second leakage current control input LCC2 and an output connected to the node N4.

The slave stage 11b includes a slave input stage 12b having a third input NAND gate 32c and a fourth input NAND gate 32d. The third input NAND gate 32c has a data input connected to the node N3 and a clock input connected to the clock input C through a NAND gate 34. The fourth input NAND gate 32d has a data input connected to the node N4 and a clock input connected to the clock input C through the NAND gate 34. The output of the third input NAND gate 32c is connected to the node N5 and the output of the fourth input NAND gate 32d is connected to the node N6.

The slave stage 11b includes a slave output stage 14b having a third output NAND gate 20c and a fourth output NAND gate 20d which together comprise an output set-reset latch. The third output NAND gate 20c has a third A input A3, a third B input B3, a third leakage current control input LCC3 and an output Q. The fourth output NAND gate 20d has a fourth A input A4, a fourth B input B4, a fourth leakage current control input LCC4 and an output QN.

As shown in FIG. 4, a signal line 36 connects the output of the fourth output NAND gate 20d to an input of the first input NAND gate 32a, and a signal line 38 connects the output of the third output NAND gate 20c to an input of the second input NAND gate 32b.

The master and slave output stages 14a and 14b of this embodiment reduce leakage current in much the same way as described above with respect to the embodiment of FIG. 1.

The foregoing descriptions of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A digital switching circuit for receiving a clock signal and a data signal and for generating a first output signal and a second output signal based on the clock signal and the data signal, the digital switching circuit comprising:
   an input stage comprising:
      a clock input for receiving the clock signal,
      a data input for receiving the data signal,
      a first set-reset latch for generating a first node signal on a first node, and
      a second set-reset latch for generating a second node signal on a second node, and
   an output stage comprising:
      a first NAND gate having:
         a first A input connected to the first node of the input stage,
         a first B input connected to a second NAND gate output,
         a first leakage current control input connected to the second node of the input stage, and
         a first NAND gate output for providing the first output signal,
      a second NAND gate having:
         a second A input connected to the second node of the input stage,
         a second B input connected to the first NAND gate output,
         a second leakage current control input connected to the first node of the input stage, and
         the second NAND gate output for providing the second output signal,
   wherein leakage current through the first NAND gate is substantially reduced based on application of the second node signal to the first leakage current control input, and leakage current through the second NAND gate is substantially reduced based on application of the first node signal to the second leakage current control input.

2. The digital switching circuit of claim 1 wherein the input stage and the output stage together comprise an edge-triggered D flip-flop.

3. The digital switching circuit of claim 1 wherein the output stage comprises a set-reset latch.

4. The digital switching circuit of claim 1 wherein:
the first NAND gate further comprises:
  a first pair of parallel-connected PMOS transistors, one having a gate connected to the first A input and the other having a gate connected to the first B input,
  a first PMOS transistor having a drain connected to sources of the first pair of parallel-connected PMOS transistors, a source connected to the first NAND gate output, and a gate connected to first leakage current control input, and
  a first pair of series-connected NMOS transistors, one having a gate connected to the first A input and a drain connected to the first NAND gate output, and the other having a gate connected to the first B input, and
the second NAND gate further comprises:
  a second pair of parallel-connected PMOS transistors, one having a gate connected to the second A input and the other having a gate connected to the second B input,
  a second PMOS transistor having a drain connected to sources of the second pair of parallel-connected PMOS transistors, a source connected to the second NAND gate output, and a gate connected to second leakage current control input, and
  a second pair of series-connected NMOS transistors, one having a gate connected to the second A input and a drain connected to the second NAND gate output, and the other having a gate connected to the second B input,
wherein the second node signal applied to the gate of the first PMOS transistor causes the first PMOS transistor to switch off, thereby substantially reducing leakage current flowing through the first pair of parallel-connected PMOS transistors and the first pair of series-connected NMOS transistors, and
wherein the first node signal applied to the gate of the second PMOS transistor causes the second PMOS transistor to switch off, thereby substantially reducing leakage current flowing through the second pair of parallel-connected PMOS transistors and the second pair of series-connected NMOS transistors.

5. A set-reset latch circuit comprising first and second NAND gates for receiving first and second input signals and providing first and second output signals,
wherein:
the first NAND gate comprises:
  a first A input for receiving the first input signal,
  a first B input connected to a second NAND gate output,
  a first leakage current control input connected to a second A input of the second NAND gate, and
  a first NAND gate output for providing the first output signal, and
the second NAND gate comprises:
  the second A input for receiving the second input signal,
  a second B input connected to the first NAND gate output,
  a second leakage current control input connected to the first A input of the first NAND gate, and
  the second NAND gate output for providing the second output signal,
wherein leakage current through the first NAND gate is substantially reduced based on application of the second input signal to the first leakage current control input, and leakage current through the second NAND gate is substantially reduced based on application of the first input signal to the second leakage current control input.

6. The set-reset latch circuit of claim 5 wherein:
the first NAND gate further comprises:
  a first pair of parallel-connected PMOS transistors, one having a gate connected to the first A input and the other having a gate connected to the first B input,
  a first PMOS transistor having a drain connected to sources of the first pair of parallel-connected PMOS transistors, a source connected to the first NAND gate output, and a gate connected to first leakage current control input, and
  a first pair of series-connected NMOS transistors, one having a gate connected to the first A input and a drain connected to the first NAND gate output, and the other having a gate connected to the first B input, and
the second NAND gate further comprises:
  a second pair of parallel-connected PMOS transistors, one having a gate connected to the second A input and the other having a gate connected to the second B input,
  a second PMOS transistor having a drain connected to sources of the second pair of parallel-connected PMOS transistors, a source connected to the second NAND gate output, and a gate connected to second leakage current control input, and
  a second pair of series-connected NMOS transistors, one having a gate connected to the second A input and a drain connected to the second NAND gate output, and the other having a gate connected to the second B input,
wherein the second input signal applied to the gate of the first PMOS transistor causes the first PMOS transistor to switch off, thereby substantially reducing leakage current flowing through the first pair of parallel-connected PMOS transistors and the first pair of series-connected NMOS transistors, and
wherein the first input signal applied to the gate of the second PMOS transistor causes the second PMOS transistor to switch off, thereby substantially reducing leakage current flowing through the second pair of parallel-connected PMOS transistors and the second pair of series-connected NMOS transistors.

7. A digital switching circuit for receiving a clock signal, a first data signal, and a second data signal, and for generating a first output signal and a second output signal based on the clock signal and the first and second data signals, the digital switching circuit comprising:
a master input stage comprising:
  a first input NAND gate having:
    a clock input for receiving the clock signal,
    a J input for receiving the first data signal, and
    an output for providing a first node signal on a first node, and
  a second input NAND gate having:
    a clock input for receiving the clock signal,
    a K input for receiving the second data signal, and
    an output for providing a second node signal on a second node, and
a master output stage comprising first and second output NAND gates, wherein
  the first output NAND gate includes:
    a first A input connected to the first node,
    a first B input connected to an output of the second output NAND gate,
    a first leakage current control input connected to the second node, and
    an output for providing a third node signal on a third node, and the second output NAND gate includes:
a second A input connected to the second node,
a second B input connected to the output of the first output NAND gate,
a second leakage current control input connected to the first node, and
the output for providing a fourth node signal on a fourth node,
a slave input stage comprising:
a third input NAND gate having:
a clock input for receiving the clock signal,
an input connected to the third node, and
an output for providing a fifth node signal on a fifth node, and
a fourth input NAND gate having:
a clock input for receiving the clock signal,
an input connected to the fourth node, and
an output for providing a sixth node signal on a sixth node, and
a slave output stage comprising third and fourth output NAND gates, wherein
the third output NAND gate includes:
a third A input connected to the fifth node,
a third B input connected to an output of the fourth output NAND gate,
a third leakage current control input connected to the sixth node, and
an output for providing the first output signal, and
the fourth output NAND gate includes:
a fourth A input connected to the sixth node,
a fourth B input connected to the output of the third output NAND gate,
a fourth leakage current control input connected to the fifth node, and
the output for providing the second output signal,
wherein leakage current through the first output NAND gate is substantially reduced based on application of the second node signal to the first leakage current control input, leakage current through the second output NAND gate is substantially reduced based on application of the first node signal to the second leakage current control input, leakage current through the third output NAND gate is substantially reduced based on application of the sixth node signal to the third leakage current control input, and leakage current through the fourth output NAND gate is substantially reduced based on application of the fifth node signal to the fourth leakage current control input.

8. The digital switching circuit of claim 7 wherein the master input stage, master output stage, slave input stage and slave output stage together comprise an edge-triggered JK master-slave flip-flop.

9. The digital switching circuit of claim 7 wherein the master output stage and slave output stage each comprise a set-reset latch.

10. The digital switching circuit of claim 7 wherein the second output signal is connected to an input of the first input NAND gate and the first output signal is connected to an input of the second input NAND gate.

11. The digital switching circuit of claim 7 wherein:
the first output NAND gate further comprises:
a first pair of parallel-connected PMOS transistors, one having a gate connected to the first A input and the other having a gate connected to the first B input,
a first PMOS transistor having a drain connected to sources of the first pair of parallel-connected PMOS transistors, a source connected to the output of the first output NAND gate, and a gate connected to first leakage current control input, and
a first pair of series-connected NMOS transistors, one having a gate connected to the first A input and a drain connected to the output of the first output NAND gate, and the other having a gate connected to the first B input, and
the second output NAND gate further comprises:
a second pair of parallel-connected PMOS transistors, one having a gate connected to the second A input and the other having a gate connected to the second B input,
a second PMOS transistor having a drain connected to sources of the second pair of parallel-connected PMOS transistors, a source connected to the output of the second output NAND gate, and a gate connected to second leakage current control input, and
a second pair of series-connected NMOS transistors, one having a gate connected to the second A input and a drain connected to the output of the second output NAND gate, and the other having a gate connected to the second B input,
wherein the second node signal applied to the gate of the first PMOS transistor causes the first PMOS transistor to switch off, thereby substantially reducing leakage current flowing through the first pair of parallel-connected PMOS transistors and the first pair of series-connected NMOS transistors, and
wherein the first node signal applied to the gate of the second PMOS transistor causes the second PMOS transistor to switch off, thereby substantially reducing leakage current flowing through the second pair of parallel-connected PMOS transistors and the second pair of series-connected NMOS transistors.

12. The digital switching circuit of claim 7 wherein:
the third output NAND gate further comprises:
a third pair of parallel-connected PMOS transistors, one having a gate connected to the third A input and the other having a gate connected to the third B input,
a third PMOS transistor having a drain connected to sources of the third pair of parallel-connected PMOS transistors, a source connected to the output of the third output NAND gate, and a gate connected to third leakage current control input, and
a third pair of series-connected NMOS transistors, one having a gate connected to the third A input and a drain connected to the output of the third output NAND gate, and the other having a gate connected to the third B input, and
the fourth output NAND gate further comprises:
a fourth pair of parallel-connected PMOS transistors, one having a gate connected to the fourth A input and the other having a gate connected to the fourth B input,
a fourth PMOS transistor having a drain connected to sources of the fourth pair of parallel-connected PMOS transistors, a source connected to the output of the fourth output NAND gate, and a gate connected to fourth leakage current control input, and
a fourth pair of series-connected NMOS transistors, one having a gate connected to the fourth A input and a drain connected to the output of the fourth output NAND gate, and the other having a gate connected to the fourth B input,
wherein the sixth node signal applied to the gate of the third PMOS transistor causes the third PMOS transistor to switch off, thereby substantially reducing leakage current flowing through the third pair of parallel-connected PMOS transistors and the third pair of series-connected NMOS transistors, and wherein the fifth node signal applied to the gate of the fourth PMOS transistor causes the fourth PMOS transistor to switch off, thereby substantially reducing leakage current flowing through the fourth pair of parallel-connected PMOS transistors and the fourth pair of series-connected NMOS transistors.

13. A digital switching circuit comprising:
an input stage comprising:
  a first input NAND gate having:
    a clock input for receiving a clock signal,
    at least one data input for receiving a first data signal, and
    an output, and
  a second input NAND gate having:
    a clock input for receiving the clock signal,
    at least one data input for receiving a second data signal, and
    an output, and
an output stage comprising first and second output NAND gates, wherein
  the first output NAND gate includes:
    a first A input connected to the output of the second input NAND gate,
    a first B input connected to an output of the second output NAND gate,
    a first leakage current control input connected to the output of the second input NAND gate, and
    an output, and
  the second output NAND gate includes:
    a second A input connected to the output of the first input NAND gate,
    a second B input connected to the output of the first output NAND gate,
    a second leakage current control input connected to the output of the first input NAND gate, and
    an output,
wherein leakage current through the first output NAND gate is substantially reduced based on connection of the output of the second input NAND gate to the first leakage current control input, and leakage current through the second output NAND gate is substantially reduced based on connection of the output of the first input NAND gate to the second leakage current control input.

14. The digital switching circuit of claim 13 wherein:
the first output NAND gate further comprises:
  a first pair of parallel-connected PMOS transistors, one having a gate connected to the first A input and the other having a gate connected to the first B input,
  a first PMOS transistor having a drain connected to sources of the first pair of parallel-connected PMOS transistors, a source connected to the output of the first output NAND gate, and a gate connected to first leakage current control input, and
  a first pair of series-connected NMOS transistors, one having a gate connected to the first A input and a drain connected to the output of the first output NAND gate, and the other having a gate connected to the first B input, and
the second output NAND gate further comprises:
  a second pair of parallel-connected PMOS transistors, one having a gate connected to the second A input and the other having a gate connected to the second B input,
  a second PMOS transistor having a drain connected to sources of the second pair of parallel-connected PMOS transistors, a source connected to the output of the second output NAND gate, and a gate connected to second leakage current control input, and
  a second pair of series-connected NMOS transistors, one having a gate connected to the second A input and a drain connected to the output of the second output NAND gate, and the other having a gate connected to the second B input,
wherein a signal from the output of the second input NAND gate applied to the gate of the first PMOS transistor causes the first PMOS transistor to switch off, thereby substantially reducing leakage current flowing through the first pair of parallel-connected PMOS transistors and the first pair of series-connected NMOS transistors, and
wherein a signal from the output of the first input NAND gate applied to the gate of the second PMOS transistor causes the second PMOS transistor to switch off, thereby substantially reducing leakage current flowing through the second pair of parallel-connected PMOS transistors and the second pair of series-connected NMOS transistors.

* * * * *